(12) United States Patent
Cheng

(10) Patent No.: US 9,730,348 B2
(45) Date of Patent: Aug. 8, 2017

(54) FLIP COVER STRUCTURE FOR CHASSIS

(71) Applicant: PORTWELL INC., New Taipei (TW)

(72) Inventor: Yi Chen Cheng, New Taipei (TW)

(73) Assignee: PORTWELL INC., New Taipei (TW)

( * ) Notice: Subject to any disclaimer, the term of this patent is extended or adjusted under 35 U.S.C. 154(b) by 158 days.

(21) Appl. No.: 14/867,630

(22) Filed: Sep. 28, 2015

(65) Prior Publication Data

US 2016/0345454 A1 Nov. 24, 2016

(30) Foreign Application Priority Data

May 19, 2015 (TW) .............................. 104207689 U

(51) Int. Cl.
*A47B 81/00* (2006.01)
*H05K 5/03* (2006.01)

(52) U.S. Cl.
CPC ...................................... *H05K 5/03* (2013.01)

(58) Field of Classification Search
CPC ....................................................... G06F 1/181
USPC ........................... 312/223.1, 223.2, 326–329
See application file for complete search history.

(56) References Cited

U.S. PATENT DOCUMENTS

| | | | | |
|---|---|---|---|---|
| 6,000,769 A * | 12/1999 | Chen | ....................... | G06F 1/181 16/232 |
| 6,229,710 B1 | 5/2001 | Chen | | |
| 7,184,262 B2 * | 2/2007 | Hsu | ....................... | G06F 1/1679 248/552 |
| 7,494,195 B2 * | 2/2009 | Han | ....................... | H02G 3/081 312/223.2 |
| 7,495,900 B2 * | 2/2009 | Shi | ....................... | G06F 1/181 312/223.2 |
| 7,665,813 B2 * | 2/2010 | Wang | ................... | H01R 9/2416 292/163 |
| 8,840,200 B2 * | 9/2014 | Chen | ................... | H05K 5/0221 312/223.2 |
| 2015/0061482 A1 * | 3/2015 | Yu | ....................... | H05K 5/0226 312/326 |
| 2015/0366095 A1 * | 12/2015 | Junkins | ................ | H05K 5/0256 361/679.31 |

* cited by examiner

*Primary Examiner* — Matthew Ing
(74) *Attorney, Agent, or Firm* — Muncy, Geissler, Olds & Lowe, P.C.

(57) ABSTRACT

A flip cover structure for a chassis which includes a casing, a cover covered onto the casing, a stopping member installed to the casing and at a pivoting position of the cover, a fixing component disposed on the cover and corresponsive to the stopping member, a control member movably installed to the fixing component, an acting member integrally formed with the control member and situated in a stressed state. When the cover is pivoted upward, the fixing component will be flipped together with the cover, and the acting member changes its stressed state to a released state, such that the control member is displaced by the resilience of the acting member to a position opposite to the stopping member to stop the cover at the stopping member and erect the cover at a specific angle on the casing. Therefore, maintenance persons no longer need to find extra space for accommodating the cover.

10 Claims, 6 Drawing Sheets

FLIP COVER STRUCTURE FOR CHASSIS

TECHNICAL FIELD

The technical field relates to a chassis, and more particularly to a clip cover structure for a chassis capable of maintaining a cover to be opened at a specific angle with respect to the chassis when the cover is flipped open.

BACKGROUND

In general, electronic components are installed and accommodated in a chassis. For example, the electronic components of a computer system are accommodated by a casing of the chassis. With reference to FIG. 1 for a conventional chassis, the conventional chassis comprises at least two frames 41, 42 combined into an enclosed box body which is provided for accommodating the electronic components. The frames 41, 42 are connected with reach other by screws 43, and the locking effect of the screws 43 engages the frames 41, 42 together to form a sealed chassis. For maintenance and repair, a tool is required to loosen the screws 43, and then one of the frames 42 is removed. Obviously, such operation is inconvenient and time-consuming. After the frame 42 is removed, it is necessary to have a space larger than the frame 42 to store the frame 42 temporarily before the maintenance and repair work takes place.

With reference to FIG. 2 for another conventional chassis, the conventional chassis comprises a cover 51 and a casing 52, and the cover 51 is pivotally coupled to a side of the casing 52 and pivotable with respect to the casing 52. By pivoting the cover 51 towards the casing 52, a movement for closing the cover 51 onto the casing 51 is produced to form an enclosed box body 51 for accommodating electronic components therein. Similarly, the cover 51 and the casing 52 are connected with each other by screws 53. When it is necessary to maintain or repair an electronic device, the aforementioned conventional structure can turn the cover 51 outward, but the outwardly turned cover 51 has no support or fixing devices whatsoever, so that the cover 51 may be suspended in a reclined state next to the casing 52. As a result, such arrangement occupies much space, and the present chassis is usually installed in limited space, and the aforementioned arrangement causes tremendous inconvenience to maintenance and repair.

In view of the shortcomings of the conventional chassis containing electronic devices including the issues of occupying much space and causing inconvenience to maintenance and repair and the poor structural design, the discloser of this disclosure conducted extensive researches and experiments and finally developed a flip cover structure for a chassis, and such structure has the features of using simple components, saving manufacturing costs, and making the maintenance and repair easy to overcome the shortcomings of the prior art.

SUMMARY

Therefore, it is a primary objective of this disclosure to provide a flip cover structure for a chassis, and the flip cover structure is capable of erecting and fixing a cover next to a cover when the cover is flipped upward with respect to the casing to achieve a simple and easy operation and an effect of simplifying the components.

To achieve the aforementioned objectives, this disclosure provides a flip cover structure for a chassis, and the structure is applied to a chassis, and the chassis comprises: a casing, having an accommodating space for accommodating electronic components, and the accommodating space having an opening; a cover, pivotally installed to the casing, and covered onto the opening of the casing, and the cover and the casing forming a box body, wherein the cover may be pivoted to cover the opening of the casing in order to close the accommodating space, and the cover may be flipped upward to erect at a specific angle with respect to the casing; a stopping member, fixed onto the casing, and disposed adjacent to the pivoting position of the casing and the and extended parallelly in a direction towards the opening of the accommodating space; a fixing component, installed onto the cover, and configured to be corresponsive to the stopping member, and having a fixing member fixed onto a surface of the casing facing the cover, a control member installed on the fixing member and movable back and forth in the fixing member, and an acting member integrally formed with the control member, and the acting member being situated at a stressed state when it is installed in the fixing component and installed in the cover.

In the aforementioned structure, the acting member is extended outwardly and obliquely from both left and right ends of the control member to form a cross-shaped.

In the aforementioned structure, the open end extended outwardly and obliquely from the acting member is protruded from an upper end of the control member to produce a spacing.

In the aforementioned structure, the acting member has a stressed state and a released state which are two states of the acting member which is installed in the fixing component.

In the aforementioned structure, the cover is pivotally installed to an upper end of the casing.

For maintenance and repair, a maintenance technician simply flips the cover of the casing upward, so that the cover pivotally coupled to the casing may have an angular displacement by using the pivoting end as the center to change the original stressed state of the acting member into a released state, so as to produce a resilient effect and move the control member accordingly and block the control member at the stopping member. Therefore, the cover is stopped at the stopping member to erect and maintain the cover at a substantially right angle with respect to the casing. The structure of this has the features of simple components and convenient operation and also saves space for maintenance and repair.

This disclosure will become clearer in light of the following detailed description of an illustrative embodiment of this invention described in connection with the drawings.

DESCRIPTION OF THE PREFERRED EMBODIMENTS

Figure 1:
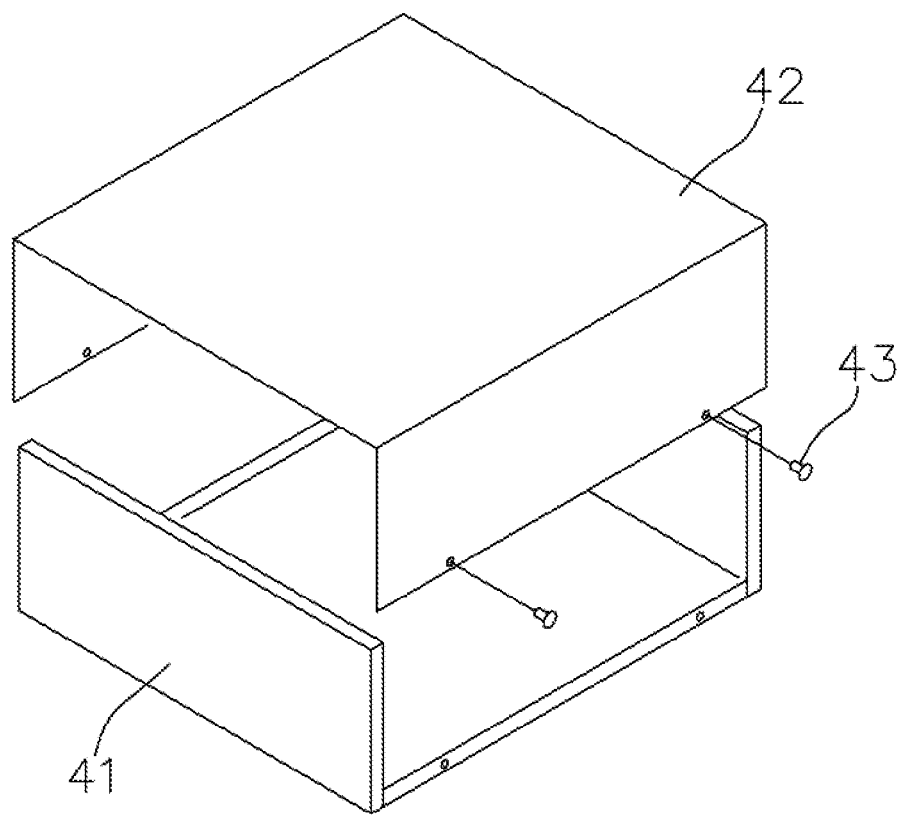
FIG. 1 is an exploded view of a first conventional structure.
Figure 2:
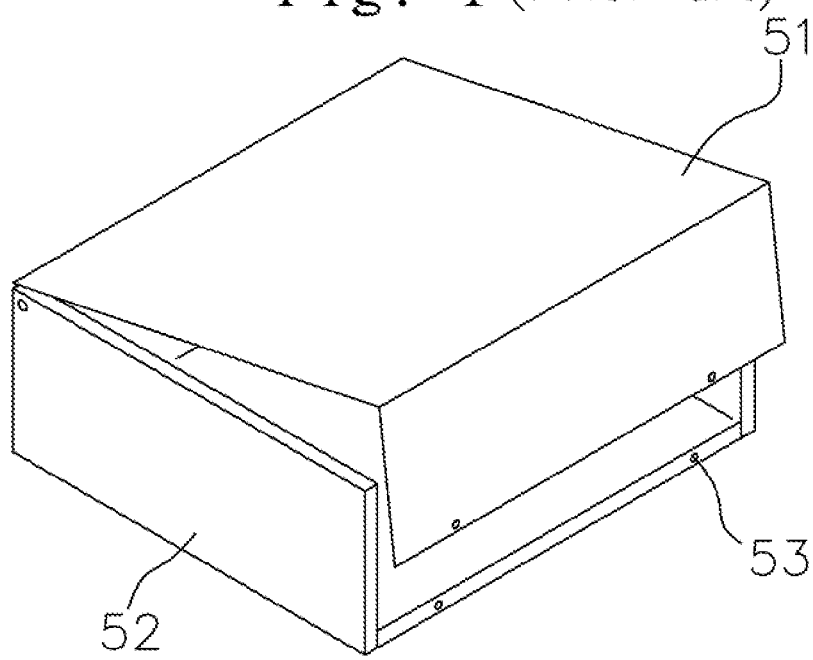
FIG. 2 is an exploded view of a second conventional structure.
Figure 3:
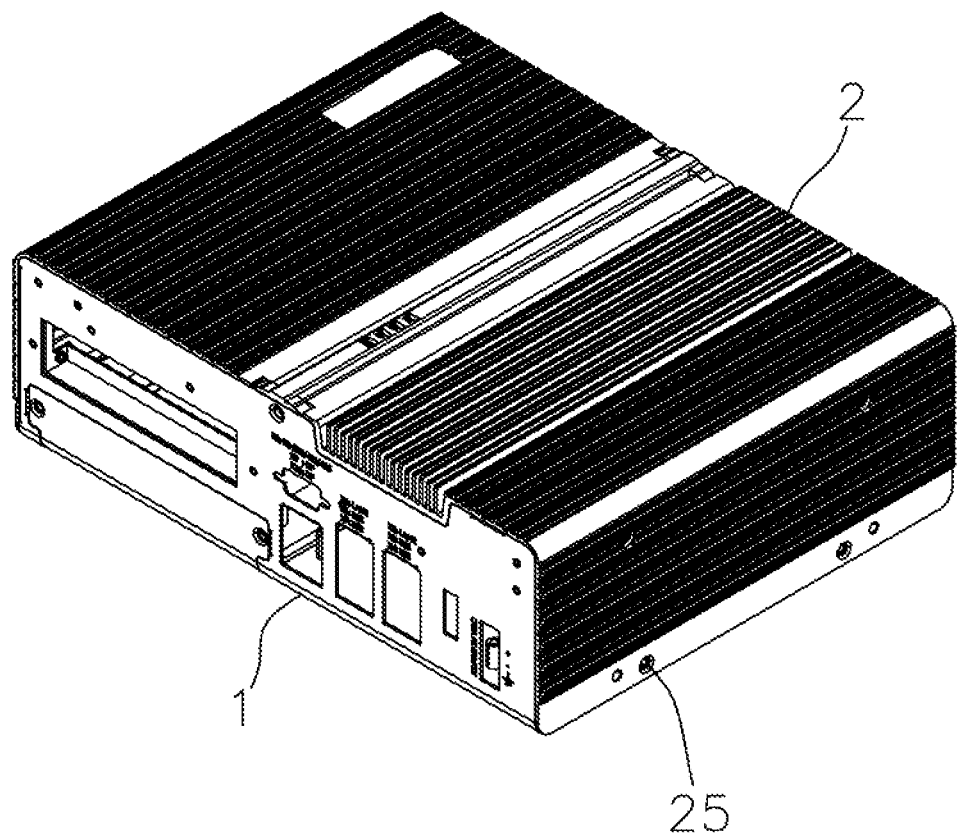
FIG. 3 is a perspective view of a cover of this disclosure when the cover is closed.
Figure 4:
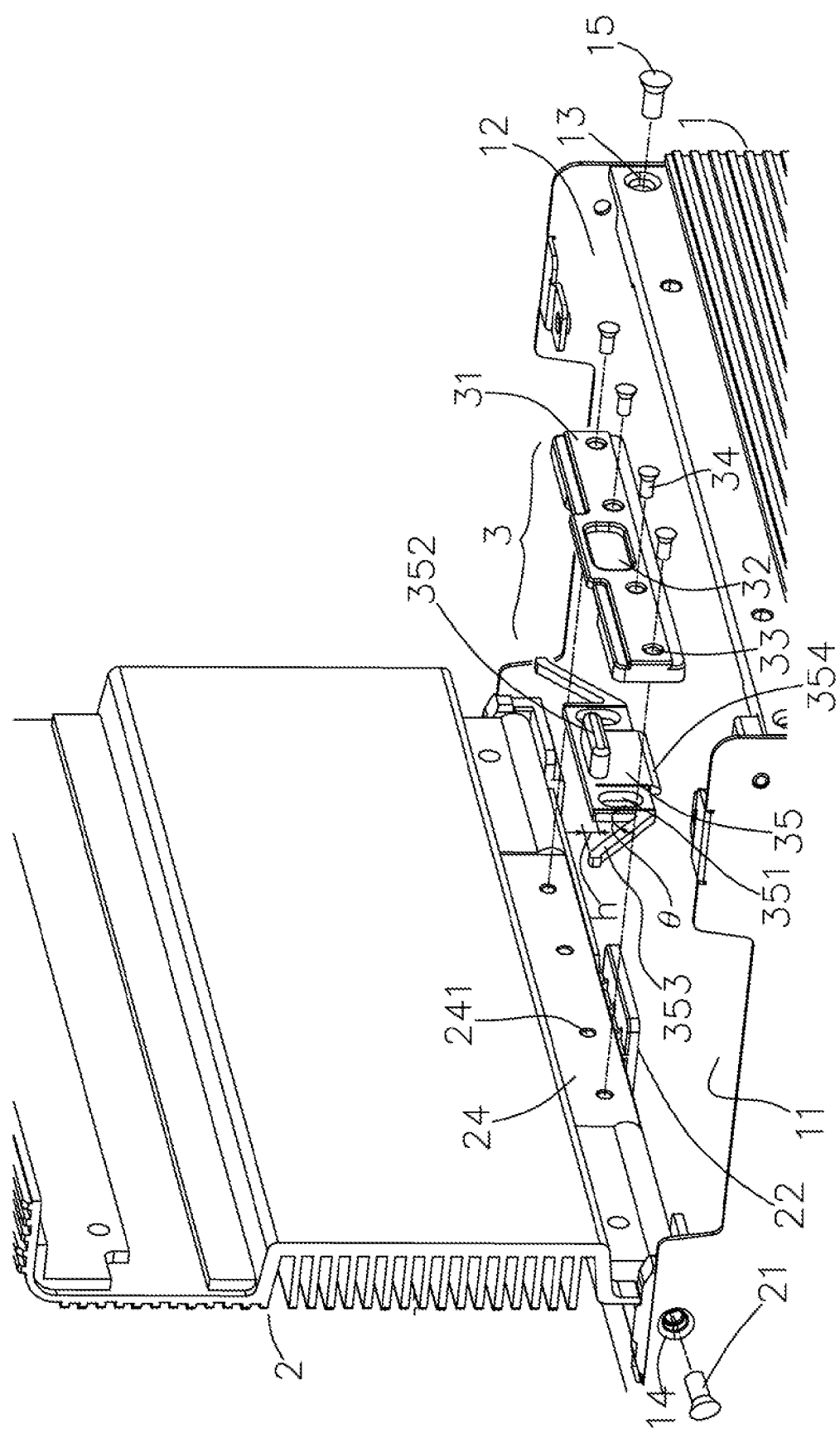
FIG. 4 is a perspective view of a cover of this disclosure when the cover is opened.

With reference to FIGS. 3 and 4 for a flip cover structure for a chassis in accordance with this disclosure, the chassis comprises a casing 1 and a cover 2.

The casing 1 has a concave accommodating space 11 for accommodating electronic components, and the accommodating space 11 has an opening 12 formed thereon, and the casing 1 has one or more through holes 13 formed thereon and at positions proximate to the opening 12, and the through holes 13 have a connecting member 15 installed therein. In this preferred embodiment, the connecting member is a screw, and the casing 1 has a pivoting hole 14 formed at the other end away from the opening 12.

Figure 8:
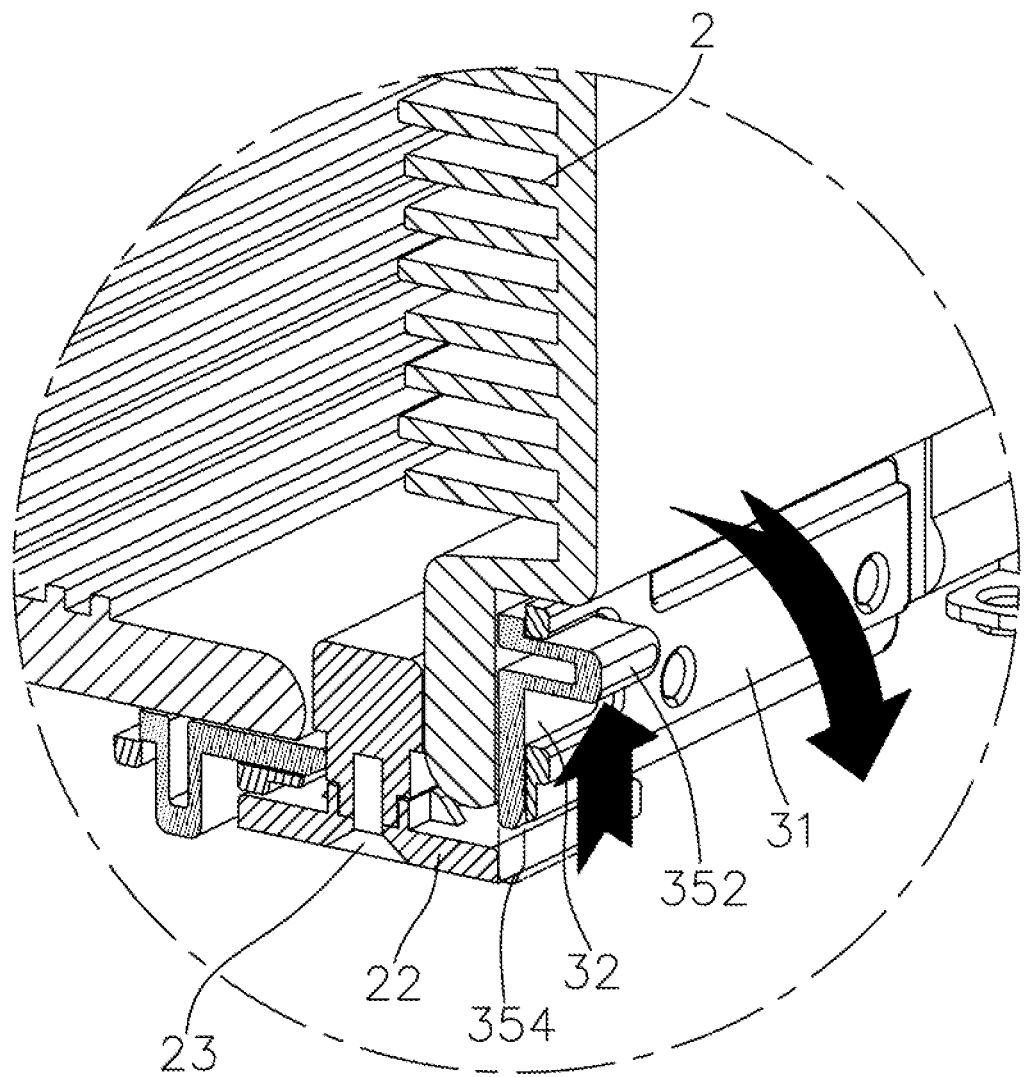
FIG. 8 is a sectional view showing the acting state of a casing when the cover of this disclosure is being closed.

The cover 2 is pivotally installed to the casing 1 (wherein the cover 2 is pivotally coupled to an upper end of the casing in this preferred embodiment cover) and covered onto the casing 1. The cover 2 and the casing 1 jointly form a box body, and a shaft 21 is formed at an end of the cover 2 and passed into the pivoting hole 14 of the casing 1 to form a pivot, and the cover 2 may be flipped to different angles with respect to the casing by using the pivoting position as a center. In addition, a stopping member 22 may be installed at a pivoting gap between the casing 1 and the cover 2 and extended parallelly towards the opening 12, wherein the stopping member 22 of this preferred embodiment is a board, and the stopping member 22 is fixed to the casing 1 by a screw 23 (as shown in FIG. 8), and the cover 2 has a concave accommodating chamber 24 adjacent to the pivoting position, and the accommodating chamber 24 is substantially in an open form, and the accommodating chamber 24 faces the accommodating space 11 of the casing 1, and the accommodating chamber 24 has one or more accommodating holes 241 formed thereon, and the cover 2 has a through hole 25 formed at a position corresponsive to the through hole 13 and provided for passing the connecting member 15 to fix onto the casing 1 (as shown in FIG. 3).

Figure 6:
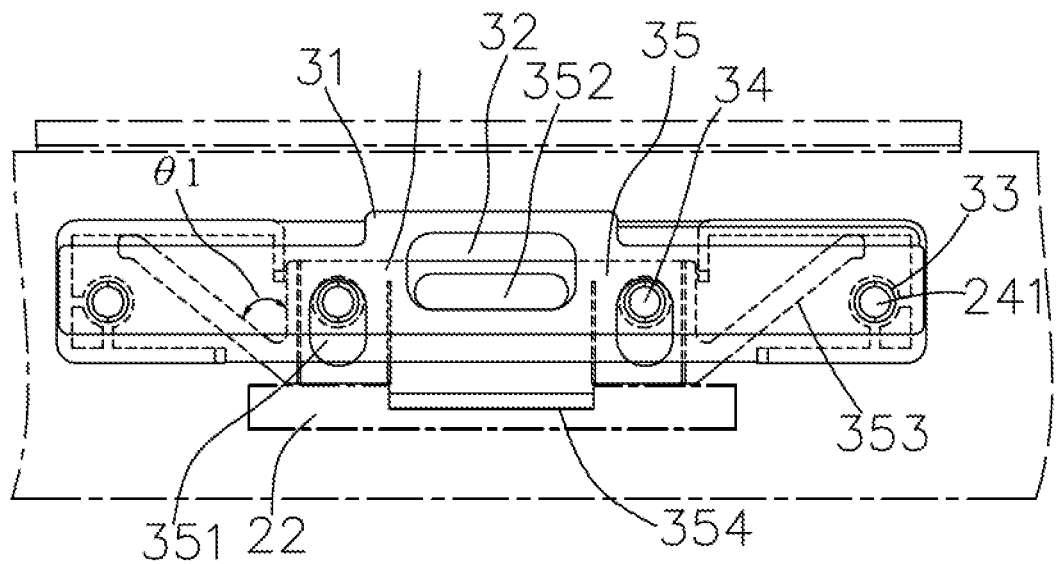
FIG. 6 is a schematic view showing the acting plane when the cover of this disclosure is turned outward.

A fixing component 3 is installed to the cover 2 and has a fixing member 31 which is a frame in this preferred embodiment, and the fixing member 31 may be fixed in the accommodating chamber 24, and the fixing member 31 has a through opening 32 and one or more fixing holes 33, and the fixing holes 33 at the relative positions of the accommodating hole 241 are provided for fixing the fixing member 31 to the accommodating chamber 24 by passing the connecting member 34 through the fixing hole 33 and the accommodating hole 241, wherein the connecting member 34 of this preferred embodiment is a screw, and a control member 35 is included between the fixing member 31 and the cover 2, wherein the control member 35 of this preferred embodiment is a board made of a plastic material, and the control member 35 has one or more slide hole 351 formed thereon and configured to be corresponsive to the fixing hole 33 and the accommodating hole 241, such that when the connecting member 34 is passed into the fixing hole 33 and the accommodating hole 241, the connecting member 34 is also passed through the slide hole 351 to clamp the control member 35 between the cover 2 and the fixing member 31, and the control member 35 is movable back and forth in the accommodating chamber 24. The control member 35 includes a dial plate 352 passing through the through opening 32 and being exposed from the through opening 32, and the control member 35 further includes an acting member 353, and the acting member 35 of this preferred embodiment is a rod integrally formed with the control member, and the acting member 353 is extended outwardly and obliquely from both right and left sides of the control member 35 (in the direction as shown in the figure) to form a cross-shaped, and the open end outwardly and obliquely extended from the acting member 353 is protruded from an upper end of control member 35 (in the direction as shown in the figure) to produce a spacing (Now, the acting member 353 is situated at a released state), so that an included angle θ is formed between the acting member 353 and the control member 35 (as shown in FIG. 4). When the fixing component 3 is installed to the cover 2, the open end of the acting member 353 abuts against the inner side of the accommodating chamber 24 to form an included angle $\theta_1$ between the acting member 353 and the control member 35, wherein the included angle $\theta_1$ is greater than included angle θ. Now, the acting member 353 is situated at a released state (as shown in FIG. 6). In addition, the control member 35 has a tab 353 formed at a lower end of the control member and extended outward, and the tab 354 is precisely blocked at an outer side of the stopping member 22.

Figure 5:
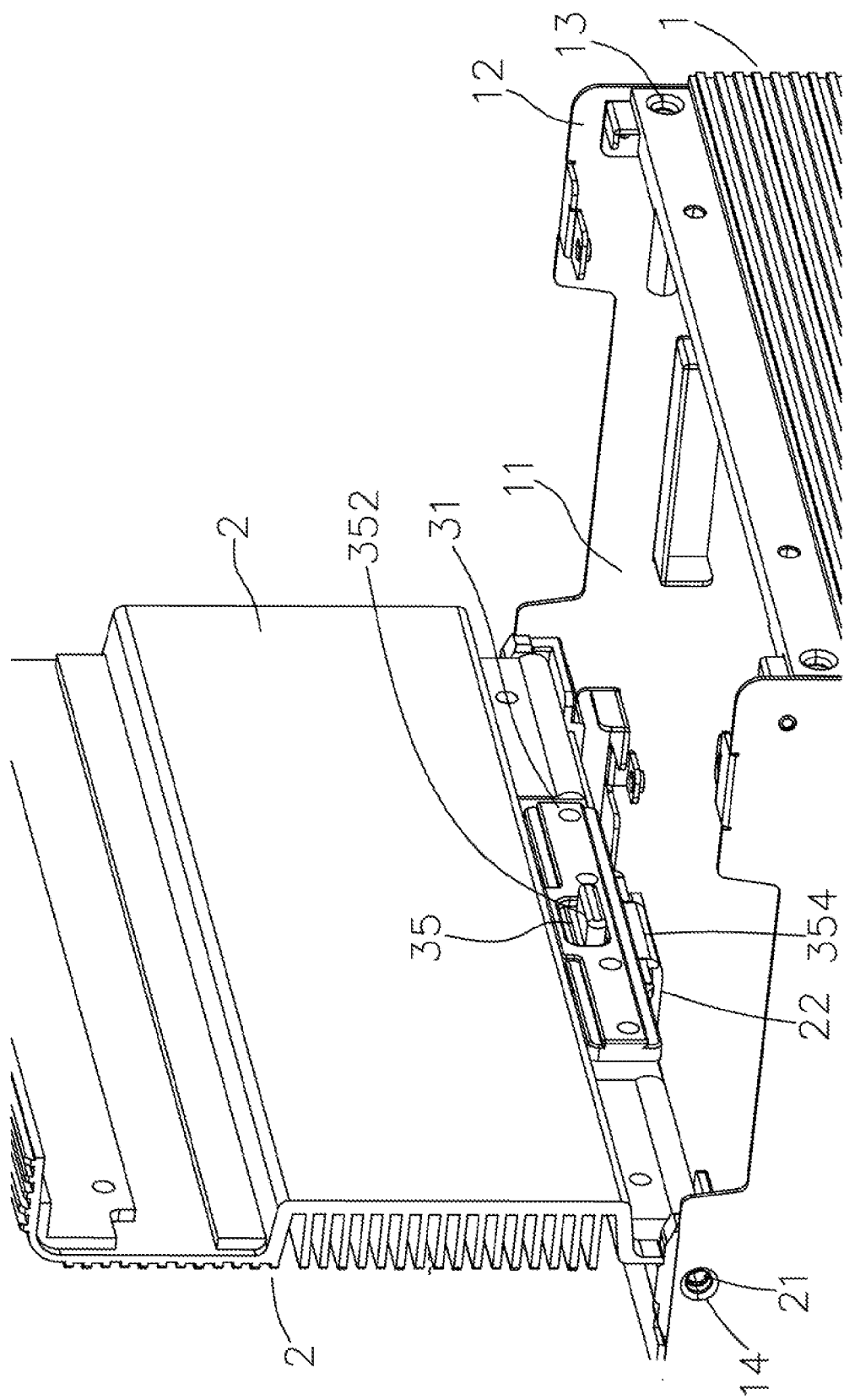
FIG. 5 is an exploded view of a flip cover structure of a cover of this disclosure.
Figure 7:
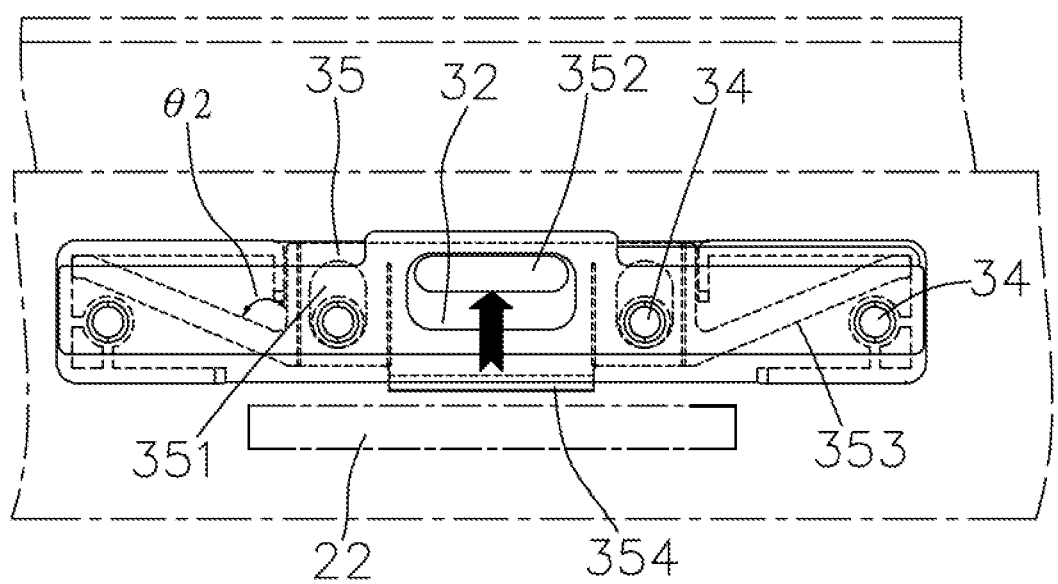
FIG. 7 is a schematic view showing the acting plane of a casing when the cover of this disclosure is closed.

In FIGS. 5, 6, and 7, a maintenance person may loosen the connecting member 15 and then flip the cover 2 upward, so that the cover 2 is moved upward at a specific angle by using the pivoting position as a center to expose the accommodating space 11 of the casing 1, and the original stressed state of the acting member 353 is switched to the release state through the resilient effect. As a result, the control member 35 is moved to shift a tab 354 of the control member 35 downward and stop at the stopping member 22. Now, an included angle $\theta_1$ is formed between the acting member 353 and the control member 35 and the included angle $\theta_1$ is greater than included angle θ (as shown in FIG. 6), so that the cover 2 is blocked at the stopping member 22 and the cover 2 is erected and maintained at a substantially right angle with respect to the casing 1. The flip cover structure of this disclosure has the features of simple components and convenient operation and save space for maintenance and repair.

In FIG. 7, it simply needs to move the dial plate 352 in the through opening 32 upward after the maintenance and repair, so that the tab 354 leaves the stopping member 22, and the acting member 353 is changed from the released state back to the original stressed state. Now, an included angle $\theta_2$ is formed between the acting member 353 and the control member 35, and the included angle $\theta_2$ is greater than the included angle θ.

Wherein, the included angle $\theta_2$ is greater than the included angle $\theta_1$, and the included angle $\theta_1$ is greater than the included angle θ.

What is claimed is:

1. A flip cover structure for a chassis, and the chassis comprising:

a casing, having an accommodating space for accommodating electronic devices and components, and the accommodating space having an opening;

a cover, pivotally installed to the casing, and covered onto the opening of the casing, and the cover and the casing forming a box body;

a stopping member, fixed onto the casing, and disposed adjacent to the pivoting position of the casing and the cover, and extended parallelly in a direction towards the opening of the accommodating space; and a fixing component, installed onto the cover, and configured to be corresponsive to the stopping member, and having a fixing member fixed onto a surface of the casing facing the cover, and a control member made of a plastic material and included between the fixing member and the cover, and the control member moving back and forth between the fixing member and the cover, and the control member having an acting member integrally formed with the control member, and the acting member being situated at a stressed state when assembled;

thereby, when the cover covered onto the casing is flipped upward to change the original stressed state of the acting member into a released state to produce a resilient effect to move the control member and block the control member at an outer side of the stopping member, so as to stop the cover at the stopping member and erect and fix the cover at a specific angle with respect to the casing.

2. The flip cover structure for a chassis according to claim 1, wherein the cover has an accommodating chamber formed at a pivoting end and facing the casing, and the accommodating chamber is provided for accommodating the fixing component.

3. The flip cover structure for a chassis according to claim 2, wherein the cover accommodating chamber has an accommodating hole formed thereon, and the fixing member has a corresponsive fixing hole formed thereon, such that the fixing member may be passed and screwed into the fixing hole and the accommodating hole by the connecting member and fixed in the accommodating chamber.

4. The flip cover structure for a chassis according to claim 1, wherein the control member has a slide hole formed thereon, and provided for passing the connecting member, so that the control member may move back and forth in the accommodating chamber.

5. The flip cover structure for a chassis according to claim 1, wherein the fixing member has a through opening formed thereon, and provided for passing a dial plate of the control member, so that the dial plate may be dialed to move the control member.

6. The flip cover structure for a chassis according to claim 1, wherein the acting member is an elastic rod.

7. The flip cover structure for a chassis according to claim 1, wherein the acting member is extended outwardly and obliquely from both left and right ends of the control member to form a cross-shaped.

8. The flip cover structure for a chassis according to claim 7, wherein the open end extended outwardly and obliquely from the acting member is protruded from an upper end of the control member to produce a spacing.

9. The flip cover structure for a chassis according to claim 1, wherein the control member has a tab formed and extended from a lower end of the control member and provided for blocking an outer side of the stopping member.

10. The flip cover structure for a chassis according to claim 9, wherein the tab is blocked at the stopping member to erect and maintain the casing at a substantially right angle with respect to the casing, when the cover is flipped upward.

* * * * *